United States Patent [19]
Dutt

[11] 4,384,398
[45] May 24, 1983

[54] ELIMINATION OF SILICON PYRAMIDS FROM EPITAXIAL CRYSTALS OF GAAS AND GAALAS

[75] Inventor: Bulusu V. Dutt, Parsippany, N.J.

[73] Assignee: Bell Telephone Laboratories, Incorporated, Murray Hill, N.J.

[21] Appl. No.: 314,858

[22] Filed: Oct. 26, 1981

[51] Int. Cl.³ .......................................... H01L 21/208
[52] U.S. Cl. ................... 29/569 L; 29/576 E; 148/171; 148/172; 156/616 A
[58] Field of Search .............................. 148/171, 172; 156/616 A; 29/576 E, 569 L

[56] References Cited

U.S. PATENT DOCUMENTS

| | | | |
|---|---|---|---|
| 3,578,513 | 5/1971 | Pilkuhn et al. | 148/171 |
| 3,676,228 | 7/1972 | Sakurai et al. | 148/171 |
| 3,705,825 | 12/1972 | Touchy et al. | 148/171 X |
| 3,783,825 | 1/1974 | Kobayasi et al. | 148/171 X |
| 3,854,447 | 12/1974 | Kobayasi | 148/171 X |
| 4,012,242 | 3/1977 | Matare | 148/171 |
| 4,088,514 | 5/1978 | Hara et al. | 148/171 |
| 4,287,848 | 9/1981 | Leibenzeder et al. | 118/415 |

*Primary Examiner*—G. Ozaki
*Attorney, Agent, or Firm*—H. W. Lockhart

[57] ABSTRACT

The occurrence of pyramidal protrusions on the surface of GaAs and GaAlAs p-n junction wafers produced by a multislice liquid phase epitaxy process is avoided by slow cooling to a specified quenching temperature or below. The pyramidal protrusions are constituted of the silicon which is the amphoteric dopant used in these semiconductors. Pyramids are not formed if the epitaxial reactor is cooled at a rate of 1° Celsius to 3° Celsius per minute to a temperature less than about 140° Celsius before the wafers are moved to the cool portion of the reactor and then further cooled to room temperature.

5 Claims, 1 Drawing Figure

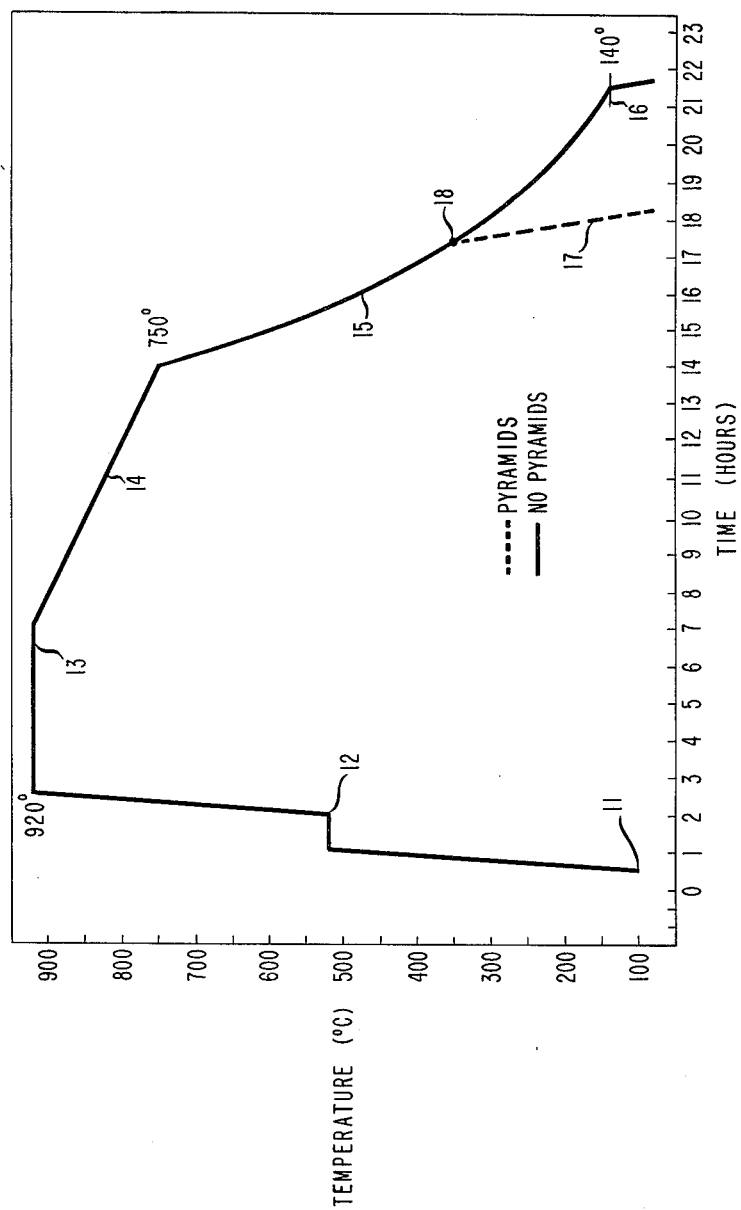

ELIMINATION OF SILICON PYRAMIDS FROM EPITAXIAL CRYSTALS OF GAAS AND GAALAS

BACKGROUND OF THE INVENTION

This invention relates to the fabrication of p-n junction wafers in GaAs and GaAlAs compound semiconductors by the liquid phase epitaxy process. More particularly, it relates to a method of avoiding the occurrence of pyramidal protrusions on the final surface of such crystals when silicon is used as the significant impurity or dopant.

Liquid phase epitaxy growth is a well-known and widely practiced technique for the manufacture of p-n junction compound semiconductor devices, particularly for use as light-emitting diodes and other optoelectronic devices. In particular, silicon is known as a particularly useful dopant for GaAs and GaAlAs because of its amphoteric character. Silicon acts as a donor impurity when incorporated in the crystal during a higher temperature range and as an acceptor impurity when incorporated during a lower temperature range. The change from one condition to the other occurs at a temperature referred to as the "transition temperature" and is utilized in the liquid phase epitaxial process to fabricate an epitaxial layer having a p-n junction formed therein. This technique is well known.

In the standard liquid phase epitaxy process in which a plurality of substrate slices are treated simultaneously, the epitaxial layers are deposited by cooling the slices and melt in a temperature range from about 920° Celsius to about 350° Celsius, with the melt continuously in contact with the substrates, after which the substrates and contacting melt are moved to a cool portion of the reactor and effectively quenched.

However, when this practice is followed, the last-formed surface, which is of p-type conductivity, contains numbers of pyramidal protrusions which were found to consist largely of silicon, the significant impurity used in these materials. The occurrence of these pyramidal protrusions results in the formation of dark-line defects at dislocation networks surrounding the pyramids and thus degrades the optical characteristics of the devices. The removal of the pyramids by etching alleviates the bonding stresses associated with these pyramids, but there are residual dislocation networks which contribute to continuing optical degradation.

A reduction in the silicon content not only does not alleviate the occurrence of the silicon pyramids, but also affects the emission characteristics of the device. Accordingly, there is a need for a means for avoiding the occurrence of such pyramidal protrusions. It is important that such means not increase the fabrication costs of such devices by increasing the time required for processing excessively or by requiring the addition of costlier materials.

SUMMARY OF THE INVENTION

Thus, a primary object of the invention is to provide an improved liquid phase epitaxial growth method for use with silicon-doped GaAs and GaAlAs which avoids the occurrence of pyramidal protrusions on the surface of the final p-type layer.

In accordance with a preferred embodiment of the invention, the crystal of GaAs or GaAlAs having n-type and p-type layers formed successively thereon by the liquid phase epitaxial growth process is slowly cooled from the final growth temperature of about 750° Celsius at a rate of from 1° Celsius to 3° Celsius per minute to a temperature of about 140° Celsius or less before the crystal is moved to the cool portion of the reactor and thereby quenched. Although this process requires some additional processing time devoted to the additional slow cooling, the time is not excessive and can be accommodated readily in the standard fabrication process. In particular, it is advantageous to carry out such slow cooling by simply turning off the reactor and allowing it to cool.

BRIEF DESCRIPTION OF THE DRAWING

The invention and its other objects and features will be more clearly understood from the following detailed description taken in conjunction with the drawing, which is a program chart of the reactor temperature of one example of this invention.

DETAILED DESCRIPTION

Liquid phase epitaxial deposition is a well-known procedure. The fabrication of GaAs and GaAlAs p-n junction wafers using silicon as a significant impurity is performed in a multislice boat in a single step operation. In a specific embodiment, the starting composition of the melt at 920° Celsius is undersaturated in arsenic and is constituted as follows, where $X_i$ represents the atom fraction of the corresponding element i: $X_{Ga}=0.951$, $X_{As}=0.044$, $X_{Al}=0.0026$, and $X_{Si}=0.0027$.

As indicated by the time-temperature program line of the drawing, the process begins at region 12 where the boat is moved into the hot zone of the epitaxial reactor. The temperature then is raised, and in region 12 at about 520° Celsius, the aluminum and, optionally, a small amount of GaAs are added to the melt.

The reactor temperature then is raised to 920° Celsius, and the charge, comprising the substrates and melt, is held at that temperature for about 4 hours. The melt then is held in contact with the solid GaAs single crystal for a period of about 30 minutes at 920° Celsius, as indicated by region 13, to allow the arsenic-deficient melt to approach the liquidus composition by dissolving approximately 50 microns of the GaAs substrates. The successive n and p layers then are grown by continuously cooling the silicon-doped melt while in contact with the substrates through a temperature range of 920° Celsius to 750° Celsius. As indicated by the region 14 of the temperature program in the drawing, this step is at a rate of about 0.4° Celsius per minute.

The amphoteric nature of silicon has been noted previously, and it appears that for temperatures above about 850° Celsius, silicon is substitutionally dissolved on the metal lattice in Ga sites and exhibits a donor behavior. Below about 850° Celsius, silicon occupies arsenic lattice sites and behaves as an acceptor. Thus, the growth temperature range from 920° Celsius down to 750° Celsius produces growth of the n and p layers in succession from the same silicon-doped melt.

The reactor then is turned off and the interior permitted to cool naturally at a rate dependent upon the reactor characteristics and the surrounding ambient. Typically, this produces a cooling rate of from 1° Celsius to 2° Celsius per minute. This cooling step is depicted by the portion 15 of the furnace program. The melt remains in contact with the epitaxial layer on the substrate as the temperature drops. It is important that this cooling rate, which may be as great as about 3° Celsius per minute, continue down to a temperature of 140° Celsius or less before the assembly is effectively quenched by moving the boat to the cool portion of the reactor. The 140° Celsius level is indicated at 16 on the program line. By following this procedure, in contrast to the previous procedure, p-n junction light-emitting diodes are fabricated in which the last grown p-type surface is devoid of any pyramidal imperfections of any size.

The broken-line program portion 17 represents previous practice with respect to the fabrication of this material. Although a slow cooling step is used, it, significantly, was terminated at about 325° Celsius to 400° Celsius, at which juncture, point 18, the boat was removed to the cool end of reactor and effectively quenched. This procedure produced a final p-type surface on the crystal containing pyramidal protrusions ranging up to from 25 to 50 microns in size.

The following table illustrates experiments demonstrating the efficacy of the slow cooling process in accordance with this invention:

TABLE I

Size Distribution Of Pyramids In GaAlAs:Si As A Function Of The Temperature, $T_q$, From Which The Boat Is Rapidly Quenched To Room Temperature

| $T_q$ | Pyramid Size μm |
|---|---|
| 400° C. | 25–50 |
| 300° C. | 1–5 |
| 200 | <1 |
| 140° C. | No Pyramids |
| 100° C. | No Pyramids |
| 25° C. | No Pyramids |

Without limiting the scope and application of the invention, the following appears to be an interpretation of its efficacy. When a solution of silicon in arsenic-saturated Ga is cooled rapidly from 400° Celsius to 50° Celsius, the solution is readily supersaturated with silicon and rejects it in the form of pyramidal protrusions. On the other hand, a slower, near-equilibrium cooling of the solution results in continued growth of silicon-doped, p-type GaAs layer. At temperatures below 140° Celsius, the nucleation of silicon as a separate phase appears to be arrested, thereby preventing the growth of the silicon pyramids.

Thus, it is important for silicon-doped GaAlAs or GaAs when subjected to elevated temperatures in the range from 750° Celsius to 920° Celsius to cool at a relatively slow rate to 140° Celsius or less before quenching.

What is claimed is:

1. A method of fabricating silicon-doped layers of GaAlAs or GaAs by liquid phase epitaxial growth characterized by the step of cooling the grown crystal to a temperature below about 140° Celsius at a rate of from 1° Celsius to 3° Celsius per minute.

2. A method of fabricating a light emitting device comprising,
   subjecting a body of single crystal compound semiconductor material selected from the group consisting of GaAs and GaAlAs to an elevated temperature while in contact with a molten mixture of said compound semiconductor which contains silicon as a significant impurity, reducing the temperature of said body and molten mixture to form, successively, an n-type and a p-type epitaxial layer on said body, and cooling said body and molten mixture at a rate not in excess of 3° Celsius per minute to a temperature of 140° Celsius or less, and then further cooling said body.

3. The method in accordance with claim 2 in which said elevated temperature is about 920° Celsius.

4. The method in accordance with claim 3 in which the temperature is reduced in the range from about 920° Celsius to about 750° Celsius to form said epitaxial layers on said body.

5. The method in accordance with claim 4 in which said body and molten mixture are cooled from about 750° Celsius to 140° Celsius at a rate of from about 1° Celsius to 3° Celsius.

* * * * *